US011849542B2

(12) United States Patent
Ito et al.

(10) Patent No.: US 11,849,542 B2
(45) Date of Patent: Dec. 19, 2023

(54) MOUNTING HEAD, METHOD FOR STORING OPERATION DATA FOR MOUNTING HEAD, AND COMPONENT MOUNTING DEVICE (71) Applicant: FUJI CORPORATION, Chiryu (JP)

(72) Inventors: Hidetoshi Ito, Okazaki (JP); Jun Iisaka, Nisshin (JP); Mitsuhiro Hashimoto, Nagoya (JP); Kazuma Hattori, Aisai (JP)

(73) Assignee: FUJI CORPORATION, Chiryu (JP)

( * ) Notice: Subject to any disclaimer, the term of this patent is extended or adjusted under 35 U.S.C. 154(b) by 237 days.

(21) Appl. No.: 17/421,082

(22) PCT Filed: Jan. 18, 2019

(86) PCT No.: PCT/JP2019/001503
§ 371 (c)(1),
(2) Date: Jul. 7, 2021

(87) PCT Pub. No.: WO2020/148895
PCT Pub. Date: Jul. 23, 2020

(65) Prior Publication Data
US 2022/0087088 A1    Mar. 17, 2022

(51) Int. Cl.
H05K 13/08    (2006.01)
H05K 13/04    (2006.01)
(52) U.S. Cl.
CPC ..... H05K 13/0895 (2018.08); H05K 13/0411 (2018.08)
(58) Field of Classification Search
CPC .......... H05K 13/0404; H05K 13/0406; H05K 13/0408; H05K 13/0409; H05K 13/041; H05K 13/0411; H05K 13/082; H05K 13/087; H05K 13/0882; H05K 13/0885; H05K 13/0895; Y10T 29/4913; Y10T 29/53174; Y10T 29/53178; Y10T 29/53191
See application file for complete search history.

(56) References Cited

U.S. PATENT DOCUMENTS

2006/0085973 A1    4/2006    Kodama et al.
2016/0249497 A1    8/2016    Ito et al.

FOREIGN PATENT DOCUMENTS

| JP | 10-284890 A | 10/1998 |
| JP | 2009-272651 A | 11/2009 |
| WO | WO 2015/063930 A1 | 5/2015 |
| WO | WO 2015/063934 A1 | 5/2015 |
| WO | WO 2019/003336 A1 | 1/2019 |

OTHER PUBLICATIONS

International Search Report dated Mar. 5, 2019 in PCT/JP2019/001503 filed Jan. 18, 2019, 1 page.

Primary Examiner — Peter Dungba Vo
Assistant Examiner — Joshua D Anderson
(74) Attorney, Agent, or Firm — Oblon, McClelland, Maier & Neustadt, L.L.P.

(57) ABSTRACT

A mounting head is configured to be detachably attached to a mounting device main body. This mounting head includes a storage section having multiple storage areas, and a storage control section configured to acquire multiple operation data relating to an operation of the mounting head individually at different timings and store the multiple operation data individually in the multiple storage areas in such a state that the mounting head is attached to the mounting device main body.

8 Claims, 9 Drawing Sheets

| ITEMS | | | APPLICATIONS |
|---|---|---|---|
| WHOLE AND MECHANICAL COMPONENTS | OPERATION TIME | | CONFIRMATION OF MAINTENANCE CYCLE |
| | NUMBER OF SHOTS | | CONFIRMATION OF MAINTENANCE CYCLES FOR Z1, Z2 AXIS ELEMENTS, RECOGNITION OF LIFE TIME OF Z1, Z2 AXIS ELEMENTS |
| | ACCUMULATED MOTOR MOVEMENT AMOUNTS | R-AXIS MOTOR | CONFIRMATION OF MAINTENANCE CYCLES FOR INDIVIDUAL AXIS ELEMENTS, RECOGNITION OF LIFE TIME OF INDIVIDUAL AXIS ELEMENTS |
| | | Q-AXIS MOTOR | |
| | | Z1-AXIS MOTOR | |
| | | Z2-AXIS MOTOR | |
| | MOTOR TORQUES (PEAK VALUES) | R-AXIS MOTOR | |
| | | Q-AXIS MOTOR | |
| | | Z1-AXIS MOTOR | |
| | | Z2-AXIS MOTOR | |
| | LAST WRITING DATE | | RECOGNITION OF DATA RECORDING TIMING |
| | NUMBER OF TIMES OF IMAGING | | RECOGNITION OF LIFE TIME OF CAMERA LIGHT SOURCES |
| CONTROL COMPONENTS | POWER-SUPPLY-ON TIME | | RECOGNITION OF LIFE TIME OF CONTROL COMPONENTS |
| | NUMBER OF TIMES OF WRITING | | RECOGNITION OF SERVICE LIFE OF MEMORY |
| | PHOTOELECTRIC CURRENT MONITOR VALUE | | RECOGNITION OF SERVICE LIFE OF PHOTOELECTRIC CONVERSION ELEMENT |
| | HEAD INTERNAL TEMPERATURE | | DETECTION OF FAILURE OF COOLING FAN, CONFIRMATION OF MAINTENANCE CYCLE OF FILTER |

Fig. 10

MOUNTING HEAD, METHOD FOR STORING OPERATION DATA FOR MOUNTING HEAD, AND COMPONENT MOUNTING DEVICE

TECHNICAL FIELD

The present description discloses a mounting head configured to be detachably attached to a mounting device main body, a method for storing operation data for the mounting head, and a component mounting device.

BACKGROUND ART

Conventionally, as such a type of mounting head, there has been proposed a mounting head that includes a memory tag that enables a rewriting of information including identification information of a head unit, and a tag reading and writing section for reading and writing information from and to the memory tag (for example, refer to Patent Literature 1). Identification information that is stored in the memory tag includes an operation time of the mounting head. As a result, it is concluded that even though head units are exchanged, frequencies at which these head units are used can be accurately obtained, whereby management work such as maintenance or the like can be facilitated.

PATENT LITERATURE

Patent Literature 1: JP-A-2009-272651

BRIEF SUMMARY

Technical Problem

However, with the mounting head described above, although the management work such as maintenance or the like can be facilitated by storing the operation time of the mounting head in the memory tag, this does not sufficiently work for obtaining the state of the mounting head in greater detail. For example, with the mounting head described above, in the case that some failure occurs, since a history of operations up to the occurrence of the failure cannot be referred to, it is difficult to identify the cause for the occurrence of the failure.

A main object of the present disclosure is to enable an operation history of a mounting head to be referred to.

Solution to Problem

The present disclosure adopts the following means to achieve the main object described above.

The gist of a mounting head of the present disclosure resides in a mounting head configured to be detachably attached to a mounting device main body, including: a storage section having multiple storage areas; and a storage control section configured to acquire multiple operation data relating to an operation of the mounting head individually at different timings and store the multiple operation data individually in the multiple storage areas in such a state that the mounting head is attached to the mounting device main body.

The mounting head of the present disclosure includes the storage section and the storage control section configured to acquire the operation data relating to the operation of the mounting head and store the operation data in the storage section. The storage section has the multiple storage areas. The storage control section acquires the multiple operation data individually at the different timings and stores the multiple operation data individually in the multiple storage areas. As a result, the operating status of the mounting head can be grasped in greater detail by referring to the history of the operation data. For example, when some failure occurs in the mounting head, the cause for the occurrence of the failure can easily be identified by referring to the history of the operation data up to the occurrence of the failure.

The gist of a mounting head operation data storing method of the present disclosure resides in an operation data storing method for storing operation data relating to an operation of a mounting head configured to be detachably attached to a mounting device main body, including: acquiring the operation data individually at multiple different timings and storing the operation data so acquired individually in such a state that the mounting head is attached to the mounting device main body.

With the mounting head operation data storing method of the present disclosure, the operation data is acquired individually at the multiple different timings, and the operation data so acquired individually is stored in such a state that the mounting head is attached to the mounting device main body. As a result, with the mounting head operation data storing method of the present disclosure, a similar advantageous effect to that provided by the mounting head of the present disclosure, that is, an advantageous effect of obtaining the operating status of the mounting head in a greater detail can be provided by referring to the history of the operation data.

The gist of a component mounting device of the present disclosure resides in a component mounting device for picking up a component and mounting the component so picked up onto a board, including: a mounting device main body; and a mounting head configured to be detachably attached to the mounting device main body and having a storage section having multiple storage areas and a storage control section configured to acquire multiple operation data relating to an operation of the mounting head individually at different timings and store the multiple operation data individually in the multiple storage areas.

The component mounting device of the present disclosure includes the mounting head of the present disclosure described above. As a result, with the component mounting device of the present disclosure, a similar advantageous effect to that provided by the mounting head of the present disclosure, that is, an advantageous effect of obtaining the operating status of the mounting head in a greater detail can be provided by referring to the history of the operation data.

DESCRIPTION OF EMBODIMENTS

Figure 1:
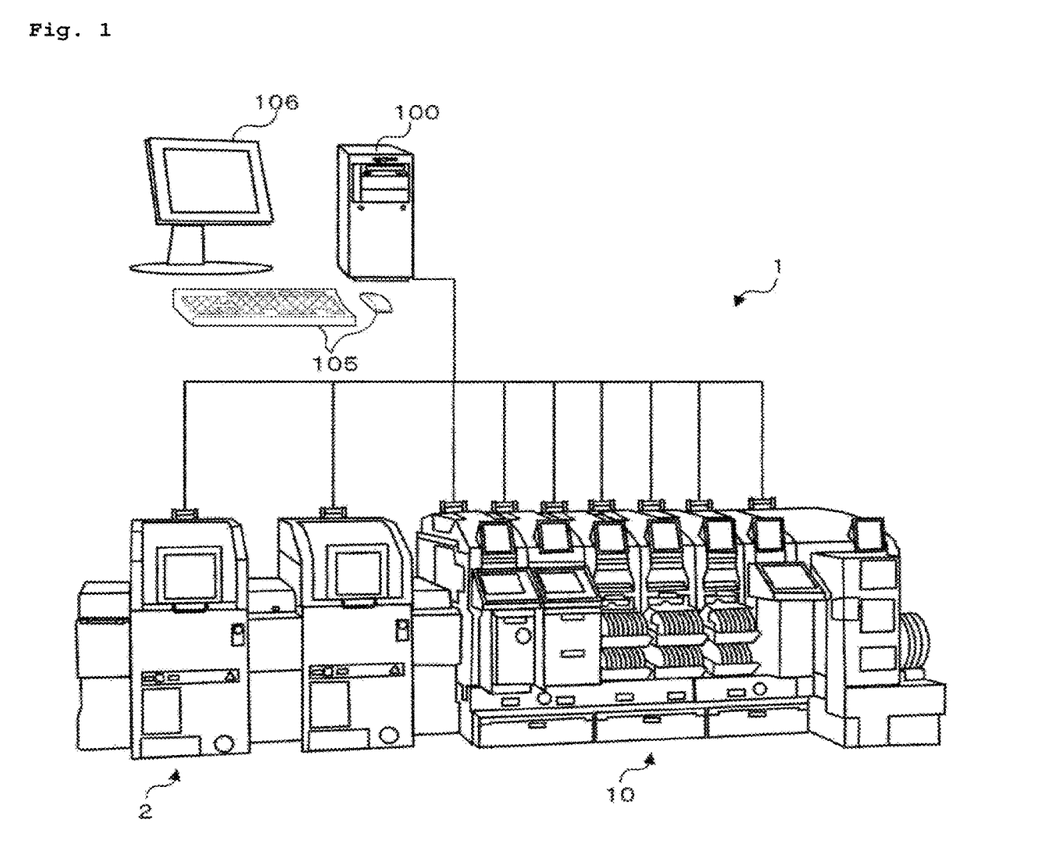
FIG. 1 is a schematic configuration view of component mounting system 1.
Figure 2:
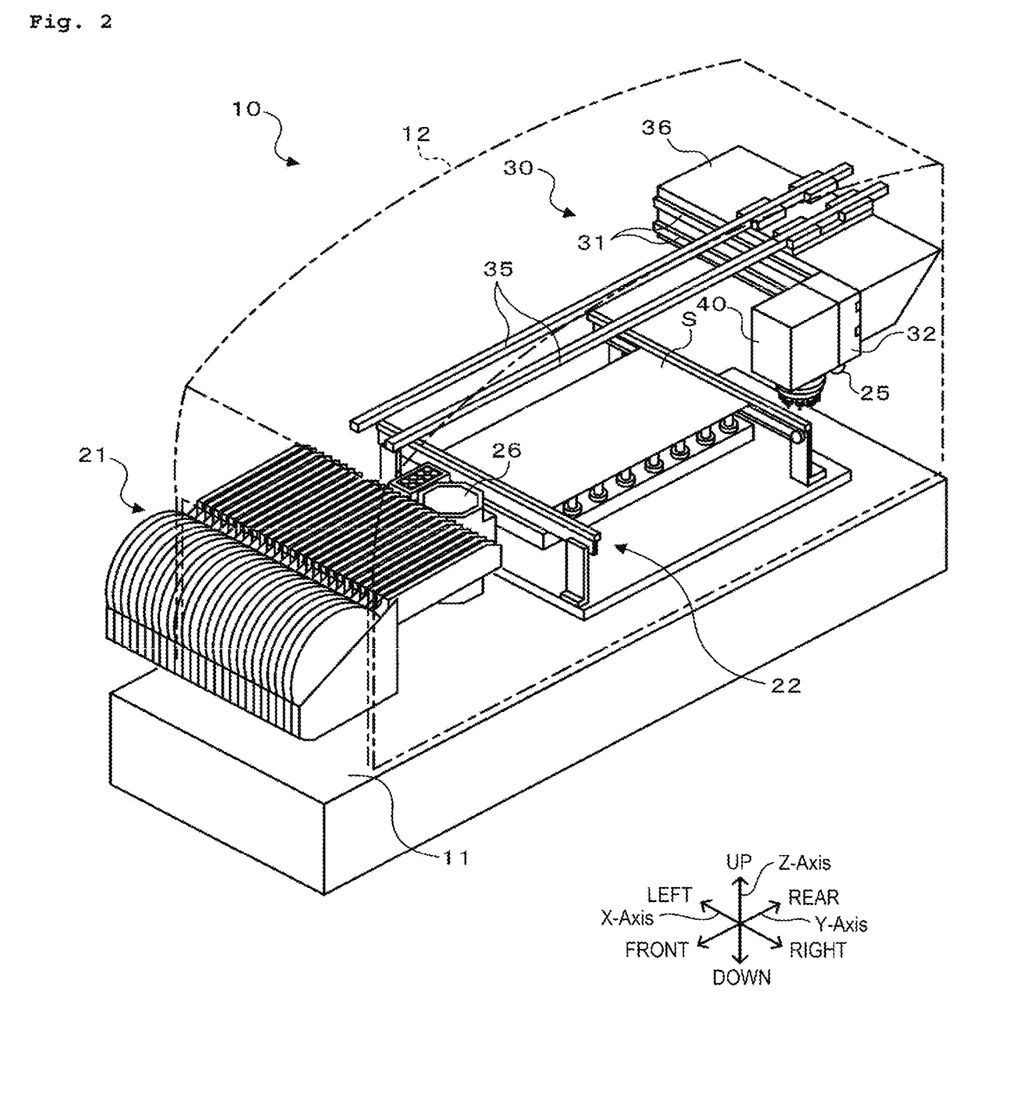
FIG. 2 is a schematic configuration view of component mounting device 10.
Figure 3:
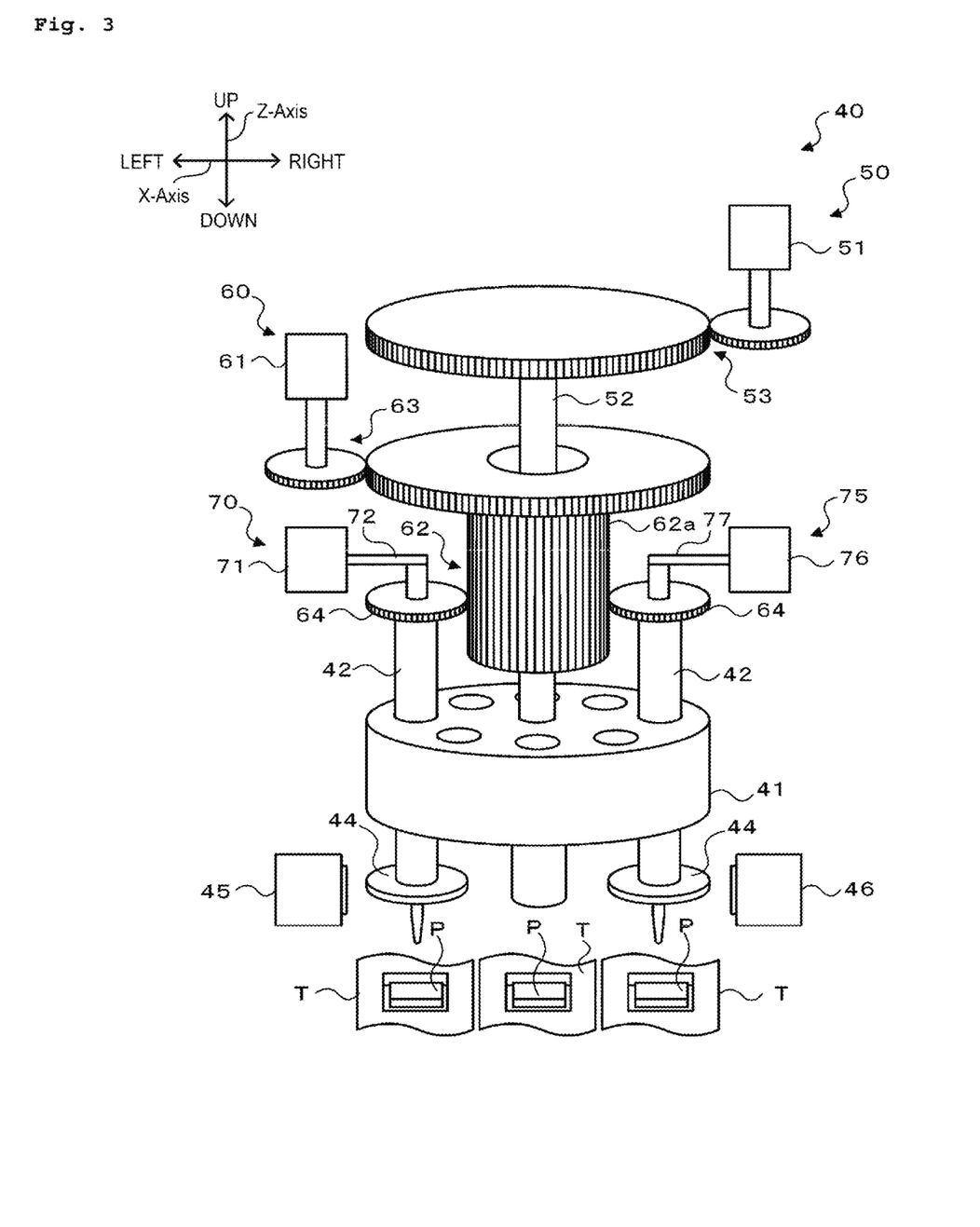
FIG. 3 is a schematic configuration view of head 40.
Figure 4:
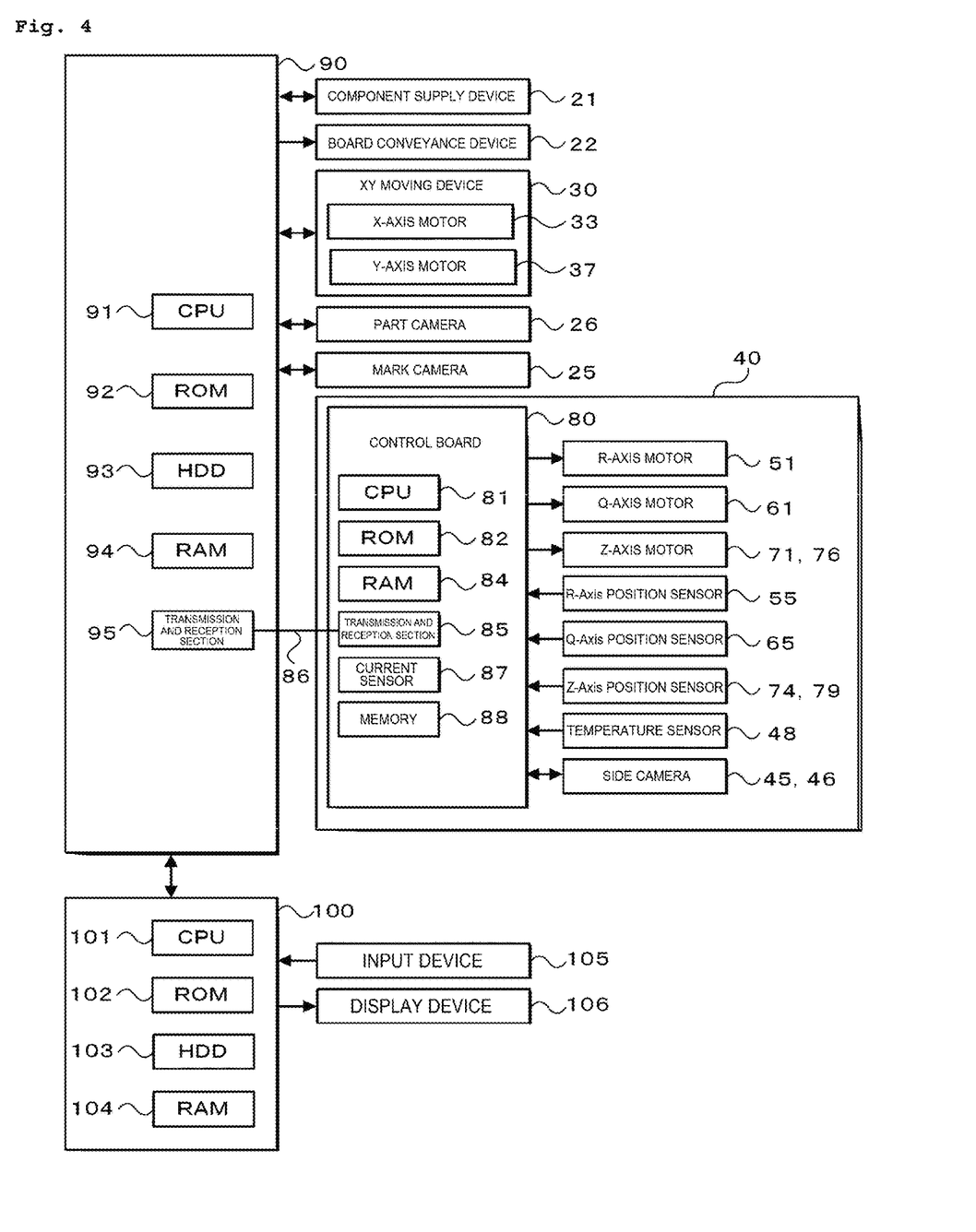
FIG. 4 is a block diagram showing an electrical connection relationship in component mounting device 10.

FIG. 1 is a schematic configuration view of component mounting system 1. FIG. 2 is a schematic configuration view of component mounting device 10. FIG. 3 is a schematic configuration view of head 40. FIG. 4 is a block diagram showing an electrical connection relationship in component mounting device 10. In FIG. 2, a left-right direction constitutes an X-axis direction, a front-rear direction constitutes a Y-axis direction, and an up-down direction constitutes a Z-axis direction.

As shown in FIG. 1, component mounting system 1 includes one or multiple screen printing machines 2, multiple component mounting devices 10, and management device 100 for managing the whole of component mounting system 1.

As shown in FIG. 2, component mounting device 10 includes component supply device 21, a mounting device main body including board conveyance device 22 and XY moving device 30, head 40, and control device 90 (refer to FIG. 4). In addition, as shown in FIG. 1, multiple component mounting devices 10 are disposed in a board conveyance direction so as to constitute a component mounting line. The mounting device main body is disposed in housing 12 supported by base 11. Component supply device 21 and head 40 are configured to be attached to and detached from the mounting device main body.

Component supply device 21 is detachably attached to each of multiple feeder bases, not shown, which are aligned in the left-right direction (the X-axis direction) at a front side of the base 11. Although not shown, component supply device 21 includes a reel around which tape T is wound, and a tape feeding mechanism including a sprocket configured to mesh with tape T and a motor for rotationally driving the sprocket. Multiple components are held onto tape T at equal intervals along a longitudinal direction of tape T. This tape T is unwound from the reel towards the rear by the tape feeding mechanism and is then fed to a component supply position with components P exposed from tape T. Component P supplied to the component supply position is picked up (picked up through suction) by pickup nozzle 44 of head 40.

Board conveyance device 22 is designed to convey in, fix, and convey out board S in the left-right direction (the X-axis direction). Board conveyance device 22 has a pair of conveyor belts that is provided in such a manner as to be spaced apart in the front-rear direction and is stretched in the left-right direction in FIG. 1. Board S is conveyed by the conveyor belts.

XY moving device 30 is designed to move head 40 over an XY-plane that follows a front surface of board S. As shown in FIG. 2, XY moving device 30 includes X-axis slider 32 and Y-axis slider 36. In addition, although not illustrated, XY moving device 30 also includes an X-axis position sensor for detecting a position of X-axis slider 32 in the X-axis direction and a Y-axis position sensor for sensing a position of the Y-axis slider 36 in the Y-axis direction. X-axis slider 32 is supported by pair of upper and lower X-axis guide rails 31 provided on a front surface of Y-axis slider 36 in such a manner as to extend in the left-right direction. X-axis slider 32 can move in the left-right direction, that is, the X-axis direction by driving X-axis motor 33 (refer to FIG. 4). Y-axis slider 36 is supported by pair of left and right Y-axis guide rails 35 provided at an upper portion of housing 12 in such a manner as to extend in the front-rear direction. Y-axis slider 36 can move in the front-rear direction, that is, the Y-axis direction by driving Y-axis motor 37 (refer to FIG. 4). Head 40 is attached to X-axis slider 32. Accordingly, head 40 can be moved in XY directions by XY moving device 30.

Head 40 picks up (picks up through suction) component P supplied from component supply device 21 with suction nozzle 44 and mounts component P so picked up onto board S fixed in place on board conveyance device 22. As shown in FIG. 3, head 40 includes head main body 41, nozzle holders 42, suction nozzles 44, side cameras 45, 46, R-axis driving device 50, Q-axis driving device 60, first Z-axis driving device 70, second Z-axis driving device 75, and control board 80. Head 40 also includes, although not shown, a cooling fan for cooling control board 80 (CPU 81) with outside air, a filter provided at an outside air intake port, and the like.

Head main body 41 is a rotating body that can be rotated by R-axis driving device 50. Nozzle holders 42 are provided in head main body 41 in such a manner as to be arranged at predetermined angular intervals in a circumferential direction and are supported in such a manner as to be freely lifted up and lowered through head main body 41. Suction nozzle 44 is detachably attached to a distal end portion of nozzle holder 42. Suction nozzle 44 picks up component P by means of a negative pressure supplied by a pressure supply device (not shown) via an internal flow path formed in nozzle holder 42 that holds suction nozzle 44 in question. In addition, suction nozzle 44 releases component P that suction nozzle 44 is holding by means of a positive pressure supplied by the pressure supply device via the internal flow path formed in nozzle holder 42. Although not shown, the pressure supply device includes a negative pressure source, a positive pressure source, and a switching valve that can switch pressures that are supplied to a suction port of each suction nozzle 44 among the negative pressure, the positive pressure, and the atmospheric pressure.

R-axis driving device 50 causes multiple nozzle holders 42 (multiple suction nozzles 44) to revolve (turn in circle) around a center axis of head main body 41 along a circumferential direction. As shown in FIG. 3, R-axis driving device 50 includes R-axis motor 51, R-shaft 52 extending in an axial direction from the center axis of head main body 41, and transmission gears 53 for transmitting the rotation of R-axis motor 51 to R-axis shaft 52. In addition, R-axis driving device 50 also includes R-axis position sensor 55 for detecting a rotational position of R-axis motor 51. R-axis driving device 50 causes head main body 41 to rotate by rotationally driving R-shaft 52 via transmission gears 53 by R-axis motor 51. Each nozzle holder 42 turns in circle (revolves) in the circumferential direction together with corresponding suction nozzle 44 as a result of the rotation of head main body 41.

Q-axis driving device 60 causes each nozzle holder 42 (each suction nozzle 44) to rotate (spin) around its own center axis. As shown in FIG. 3, Q-axis driving device 60 includes Q-axis motor 61, cylindrical member 62, transmission gears 63, and Q-axis gears 64. Cylindrical member 62 is passed over R-axis shaft 52 coaxially and relatively rotatably, and spur gear 62a is formed on an outer peripheral surface of cylindrical member 62. Transmission gears 63 transmit the rotation of Q-axis motor 61 to cylindrical member 62. Each Q-axis gear 64 is provided above corresponding nozzle holder 42 and slidably meshes with spur gear 62a of cylindrical member 62 in the Z-axis direction (the up-down direction). In addition, Q-axis driving device 60 also includes Q-axis position sensor 65 for detecting a rotational position of Q-axis motor 61. Q-axis driving device 60 can collectively rotate both Q-axis gears 64 meshing with spur gear 62a of cylindrical member 62 by rotationally driving cylindrical member 62 by use of Q-axis motor 61 via transmission gears 63. Each nozzle holder 42 rotates (spins) about its own center axis together with corresponding suction nozzle 44 as a result of the rotation of corresponding Q-axis gear 64.

First and second Z-axis driving devices 70, 75 can individually and separately lift up and lower corresponding nozzle holders 42 at two locations on a revolving (circular turning) track of nozzle holders 42. In the present embodiment, first and second Z-axis driving devices 70, 75 are provided in such a manner as to be aligned along the aligning direction (the X-axis direction) of component supply devices 21 (the tape feeders).

As shown in FIG. 3, first and second Z-axis driving devices 70, 75 include corresponding Z-axis sliders 72, 77, and corresponding Z-axis motors 71, 76 for lifting up and lowering corresponding Z-axis sliders 72, 77. In addition, first and second Z-axis driving devices 70, 75 also include corresponding Z-axis position sensors 74, 79 for detecting lifting and lowering positions of corresponding Z-axis sliders 72 and 77. First and second Z-axis driving devices 70, 75 lift up or lower corresponding Z-axis sliders 72, 77 by driving corresponding Z-axis motors 71, 76 to thereby bring Z-axis sliders 72, 77 into abutment with corresponding nozzle holders 42, lying below Z-axis sliders 72, 77, which enables nozzle holders 42 to lift up or lowered together with corresponding suction nozzles 44. However, first and second Z-axis driving devices 70, 75 may use linear motors as Z-axis motors 71, 76 so as to lift up or lower corresponding Z-axis sliders 72 77, or first and second Z-axis driving devices 70, 75 may use rotation motors and ball screw mechanisms so as to lift up or lower corresponding Z-axis sliders 72, 77. In addition, first and second Z-axis driving devices 70, 75 may be configured to lift up or lower corresponding Z-axis sliders 72, 77 by use of actuators such as air cylinders instead of Z-axis motors 71, 76. In this way, head 40 of the present embodiment includes two Z-axis driving devices 70, 75 for lifting up or lowering corresponding nozzle holders 42 (corresponding suction nozzles 44) individually and separately, whereby pickup operations of components P with suction nozzles 44 can be executed individually and separately by use of those two Z-axis driving devices 70, 75. Thus, with this head 40, by supplying two components P from component supply device 21 while disposing them at a similar interval to that at which two suction nozzles 44, which can be lifted up or lowered by two Z-axis driving devices 70, 75, are disposed, those two components P can be picked up at substantially the same time by lowering those two suction nozzles 44 at substantially the same time.

Side cameras 45, 46 image areas of corresponding suction nozzles 44 which lie near distal end portions thereof from a side for determination on whether suction nozzles 44 individually pick up corresponding components properly or suction orientations thereof after suction nozzles 44 have executed pickup operations. In the present embodiment, side camera 45 is disposed so as to image the area of corresponding suction nozzle 44 which lies near the distal end portion thereof after suction nozzle 44 in question is lowered by first Z-axis driving device 70 to execute its pickup operation. In addition, side camera 46 is disposed so as to image the area of corresponding suction nozzle 44 which lies near the distal end portion thereof after suction nozzle 44 in question is lowered by second Z-axis driving device 75 to execute its pickup operation.

Control board 80 governs the control the entire head. This control board 80 includes a microprocessor made up mainly of CPU 81, and also includes, in addition to CPU 81, ROM 82 for storing processing programs and RAM 84 used as a work region, transmission and reception section 85, current sensor 87 and operation data storage memory 88, an input and output interface, and the like. Control board 80 outputs control signals to R-axis motor 51, Q-axis motor 61, and Z-axis motors 71, 76, control signals to mark camera 25 and side cameras 45, 46, and the like. Control board 80 receives as inputs image signals from mark camera 25 and side cameras 45, 46, position signals from R-axis position sensor 55, Q-axis position sensor 65, and Z-axis position sensors 74, 79, temperature signals from temperature sensor 48 for detecting a temperature within head 40, and the like. Transmission and reception section 85 is communicably connected with transmission and reception section 95 of control device 90 of component mounting device 10 via communication line 86. In the present embodiment, communication line 86 is an optical fiber. Transmission and reception sections 85, 95 each include a photoelectric conversion element. Current sensor 87 is a sensor for monitoring a current that is photoelectrically converted at transmission and reception section 85.

Figure 5:
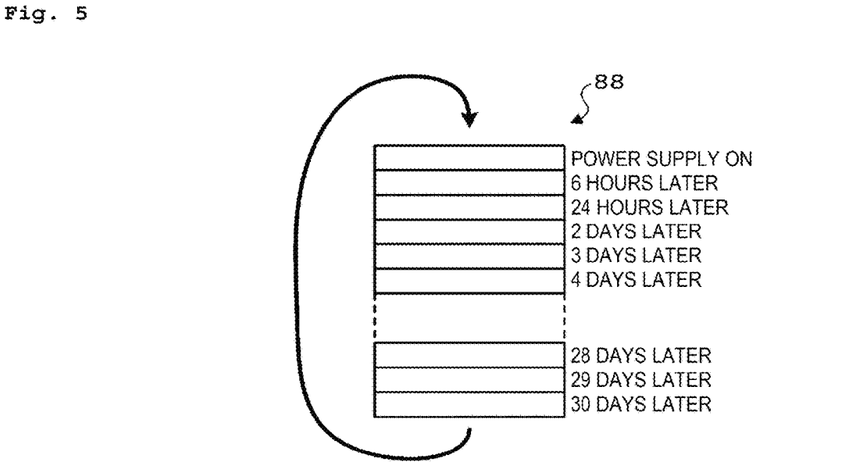
FIG. 5 is an explanatory view showing an example of a data structure of operation data storage memory 88.

Operation data storing memory 88 stores operation data of head 40. In the present embodiment, this operation data storage memory 88 is configured as a non-volatile memory that holds data even when a power source is turned off. As shown in FIG. 5, operation data storage memory 88 has multiple storage areas where operation data that are acquired individually at different timings are stored. The multiple storage areas are configured as a ring buffer. As a result, when new operation data is acquired after all of the multiple storage areas are fully occupied with operation data, the oldest one of the operation data that is stored in the multiple storage areas is replaced with the new operation data so acquired.

Mark camera 25 images an upper surface of board S conveyed in by board conveyance device 22 from above or images an upper surface of component P supplied by component supply device 21 from above. Mark camera 25 is provided on head 40 or X-axis slider 32 and can be moved in the XY directions by XY moving device 30. This mark camera 25 images a fiducial mark that is affixed to board S for use in obtaining the position of board S in question and outputs an image of the fiducial mark so captured to control device 90. In addition, mark camera 25 images an upper surface of component P and outputs an image thereof so captured to control device 90.

Part camera 26 is disposed on base 11 in a position lying between board conveyance device 22 and component supply device 21. Part camera 26 images a component picked up and held to suction nozzle 44 from below when that suction nozzle 44 holding the component passes over part camera 26 and outputs an image of the component so captured to control device 80.

As shown in FIG. 4, control device 90 is configured as a microprocessor that is made up mainly of CPU 91 and includes, in addition to CPU 91, ROM 92 for storing processing programs and HDD 93 as an external storage device for storing various types of data, RAM 94 used as a work region, an input and output interface, and the like. The external storage device is not limited to HDD 93, and hence, SSD may be used. Control device 90 outputs control signals to component supply device 21 and board conveyance device 22, head 40 (R-axis motor 51, Q-axis motor 61, Z-axis motors 71, 76, and side cameras 45, 46), mark camera 25, and part camera 26. Control device 90 receives, as inputs, signals from head 40 (R-axis position sensor 55, Q-axis position sensor 65, Z-axis position sensors 74, 79, temperature sensor 48, and side cameras 45, 46) and component supply device 21, mark camera 25, and part camera 26.

As shown in FIG. 4, management device 100 is configured as a microprocessor that is made up mainly of CPU 101 and has ROM 102 for storing processing programs, HDD 103 as an external storage device for storing various types of data, RAM 104 used as a work region, an input and output interface, and the like. The external storage device is not limited to HDD 103, and hence, SSD may be used. An input device 105 such as a keyboard and a mouse from which an operator inputs various types of commands and display 106 on which various types of information is displayed are connected to management device 100. HDD 73 stores job information including a production program and other production information. Here, the production program means a program that specifies which component is to be mounted on which board S in which order and how many boards so mounted are to be manufactured in component mounting device 10.

Figure 6:
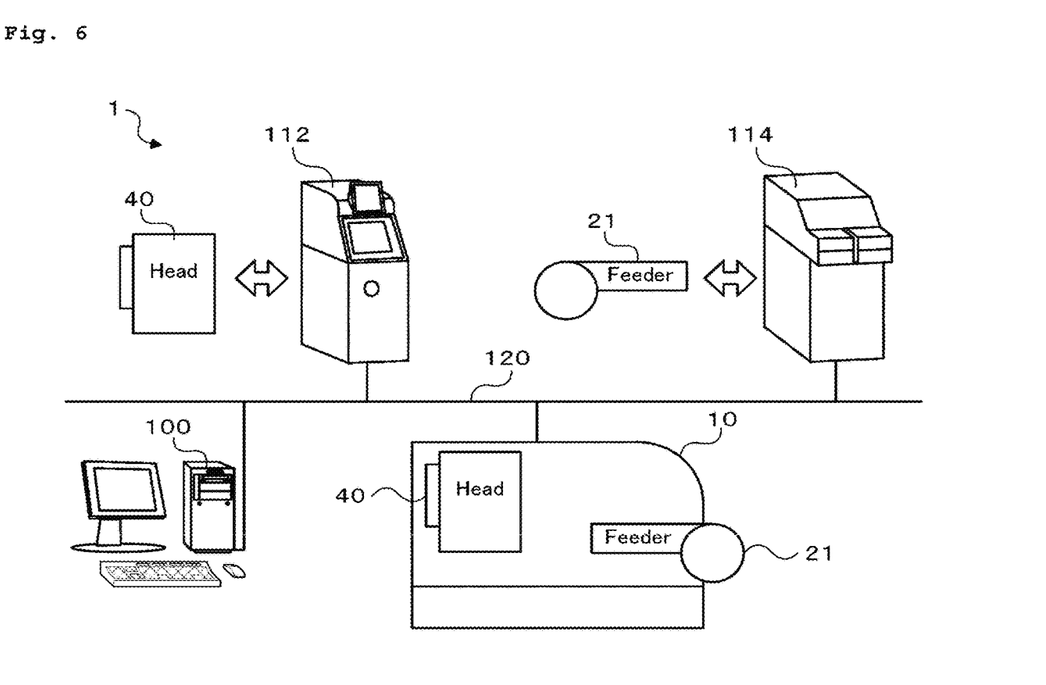
FIG. 6 is an explanatory view showing a connection relationship between component mounting system 1 and maintenance units 112, 114.

FIG. 6 is an explanatory view showing a connection relationship between component mounting system 1 and maintenance units 112, 114. Maintenance unit 112 is a unit for performing maintenance work on head 40, and performs maintenance work on head 40 when head 40 is mounted by supplying air into an internal flow path formed in nozzle holder 42. Maintenance unit 114 is a unit for performing maintenance work on component supply device 21 (a tape feeder), and performs maintenance work on component supply device 21 when component supply device 21 is mounted by supplying air or injecting a lubricant into a tape feeding mechanism. As shown in FIG. 6, maintenance units 112, 114 are connected to control device 90 of component mounting device 10 via communication network 120 to transmit maintenance information to control device 90.

Next, operations (component pickup process and component mounting process) of component mounting device 10 that is configured in the way described heretofore will be described. A component pickup process is executed when component mounting device 10 receives the job information from management device 100 and board S is conveyed into and fixed in component mounting device 10 by board conveyance device 22. In the component pickup process, CPU 91 of control device 90 causes XY moving device 30 to move head 40 so that suction nozzle 44 is located above a mounting target component. Next, CPU 91 causes the corresponding Z-axis driving device to lower nozzle holder 42 holding suction nozzle 44 so that a distal end portion of suction nozzle 44 so held by nozzle holder 42 is brought into abutment with the mounting target component. Then, CPU 91 causes a negative pressure to be applied to suction nozzle 44 in question so that suction nozzle 44 can pick up component P. When CPU 91 has caused suction nozzle 44 to pick up component P, CPU 91 causes corresponding side camera 45 or 46 to image the distal end portion of suction nozzle 44 and then determines whether component P is picked up and held to suction nozzle 44 properly based on a captured image so obtained. If there remains a vacant or free nozzle in the multiple suction nozzles of head 40 that is assumed to pick up component P, CPU 91 executes the component pickup process described above repeatedly.

When CPU 91 has caused suction nozzle 44 to pick up component P in the way described above, CPU 91 proceeds to the component mounting process. In the component mounting process, CPU 91 causes XY moving device 30 to move head 40 so that component P picked up by and held to suction nozzle 44 comes above part camera 26. Subsequently, CPU 91 causes part camera 26 to image component P so positioned. Next, CPU 91 processes a captured image so obtained so as to derive a positional deviation amount of a pickup position of component P and corrects a target mounting position for board S based on the positional deviation amount so derived. Then, CPU 91 causes XY moving device 30 to move head 40 so that component P picked up by and held to suction nozzle 44 comes above the target mounting position. Next, CPU 91 causes the corresponding Z-axis driving device to lower nozzle holder 42 so that component P picked up by and held to suction nozzle 44 is brought into abutment with board S. Then, CPU 91 causes a positive pressure to be applied to suction nozzle 44, which is now in abutment with board S, so that component P picked up by and held to suction nozzle 44 in question is mounted on board S. When CPU 91 has caused component P to be so mounted on board S, CPU 91 causes side camera 45 or 46 to image the distal end portion of suction nozzle 44 for determination of whether suction nozzle 44 has brought component P back together therewith without mounting component P on board S based on a captured image so obtained. If there remains a nozzle in the multiple suction nozzles of head 40 that is assumed to pick up component P, CPU 91 executes the component mounting process described heretofore repeatedly.

Figure 7:
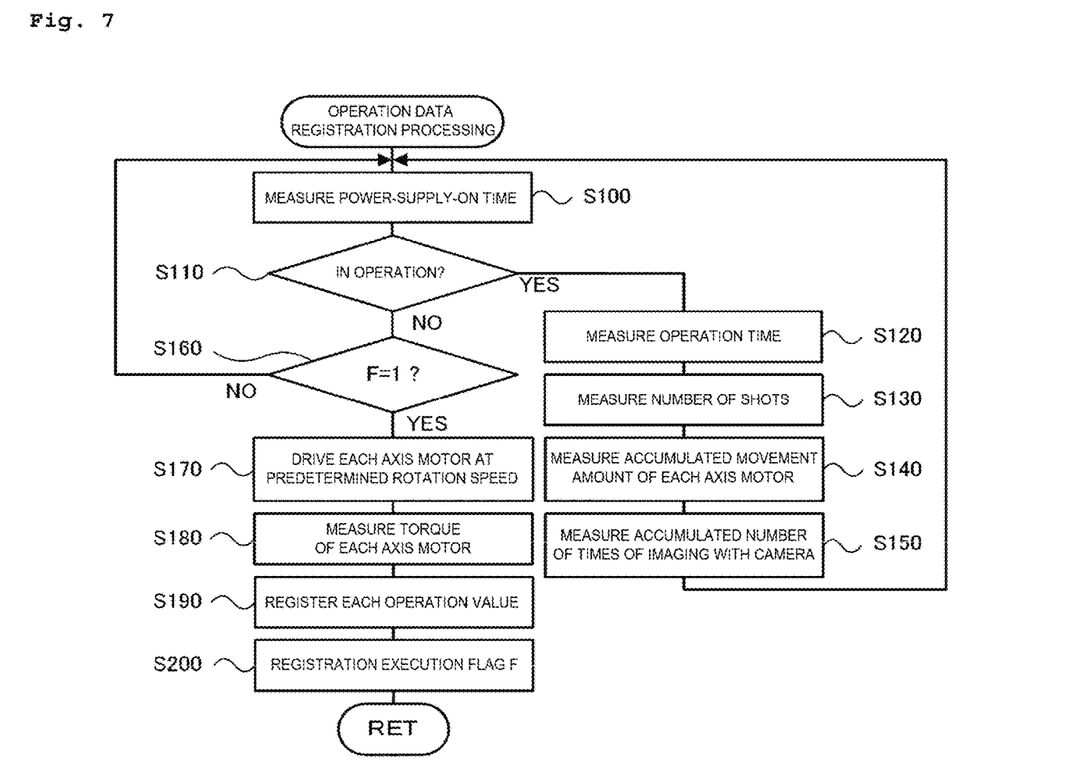
FIG. 7 is a flowchart showing an example of an operation data registration processing that is executed by control board 80 of head 40.

Next, operations will be described which are performed when operation data (operation values) of head 40 is stored in operation data storage memory 88 while head 40 is in operation. FIG. 7 is a flowchart showing an example of an operation data registration processing that is executed by CPU 81 of control board 80. This processing is repeatedly executed every predetermined time period (for example, every several tens of msec) after a power supply for head 40 is turned on.

When the operation data registration processing is executed, CPU 81 first measures a time during which a power supply for head 40 is kept on or a power-supply-on time which is an accumulated value of time from a time when the power supply is turned on to a time when the power supply is turned off (step S100). Next, CPU 81 determines whether head 40 is in operation, that is, whether the component pickup process or the component mounting process is being executed (step S110). If CPU 81 determines that head 40 is in operation, CPU 81 measures an operation time (step S120) and measures the number of shots (step S130). Here, the operation time is an accumulated time from a start of operation of head 40 to a time of a halt of operation of head 40 (an execution time of the component pickup process and an execution time of the component mounting process). Additionally, the number of shots is an accumulated number of times of upward moving and downward moving of nozzle holder 42 (one upward movement and one downward movement making one time) during in each of the component pickup process and the component mounting process. The number of shots may be measured for each nozzle holder 42, or may be measured for each Z-axis driving device used for moving nozzle holder 42 upwards and downwards. Subsequently, CPU 81 measures an accumulated movement amount of each axis motor (step S140) and measures the numbers of times of imaging of side cameras 45, 46 (step S150), returning to step S100. An accumulated movement amount of the motor is measured for each of R-axis motor 51, Q-axis motor 61, and Z-axis motors 71, 76 by accumulating amounts of positional change that is detected with each of R-axis position sensor 55, Q-axis position sensor 65, and Z-axis position sensors 74, 79.

If CPU 81 determines in step S110 that head 40 is not in operation, CPU 81 determines whether an operation data registration processing execution flag F takes a value 1 (step S160). Here, the registration execution flag F is a flag indicating whether a condition for registration of each measured operation value in operation data storage memory 88 (a registration condition) stands or does not stand, and the value 1 indicates that the registration condition stands, while a value 0 indicates that the registration condition does not stand. The determination of whether the registration condition stands or does not stand is performed by executing a stand/not-stand determination processing for registration condition shown in FIG. 8. Here, the description of the operation data registration processing is suspended to describe the stand/not-stand determination processing for registration condition.

Figure 8:
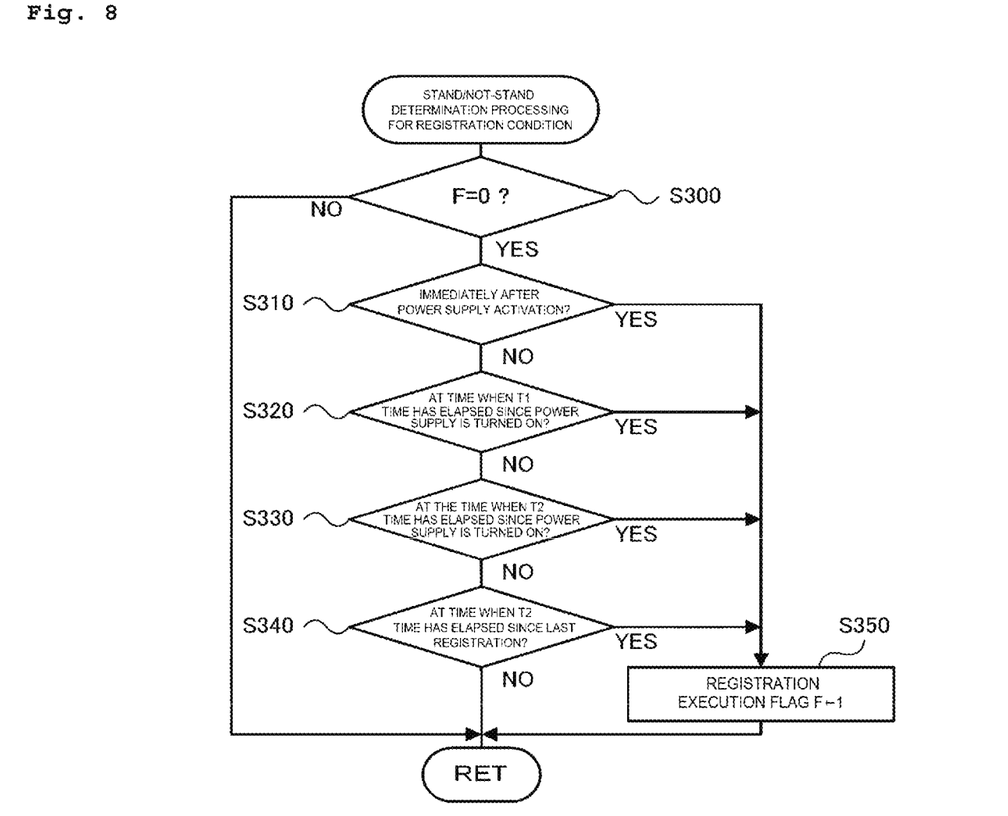
FIG. 8 is a flowchart showing an example of a stand/not-stand determination processing for registration condition that is executed by control board 80.

In the stand/not-stand determination processing for registration condition, CPU 81 first determines whether the registration execution flag F is set at the value 0 (step S300). If CPU 81 determines that the registration execution flag F takes the value 1, CPU 81 ends the stand/not-stand determination processing for registration condition as it is. On the other hand, if CPU 81 determines that the registration execution flag F takes the value 0, CPU 81 determines individually whether an elapsed time from a time when the power supply for head 40 is turned on is a time corresponding to a time that would be taken immediately after the power supply is turned on (step S310), whether the elapsed time reaches predetermined time T1 (for example, six hours) (step S320), and whether the elapsed time reaches a second predetermined time (for example, 24 hours) that is longer than predetermined time T1 (step S330). If the determinations made in steps S310 to S330 are all negative determinations, CPU 81 further determines whether an elapsed time from the time when the operation data is last registered has reached the second predetermined time (step S340). If a negative determination is made in step S340, determining that the registration condition is not made, CPU 81 ends the stand/not-stand determination processing for registration condition. If CPU 81 determines that a positive determination is made in any one of steps S310 to S340, determining that the registration condition is made, CPU 81 sets the value 1 for the registration execution flag F (step S350), ending the stand/not-stand determination processing for registration condition. In this way, the registration condition is made immediately after the power supply to head 40 is turned on, at the time when the first predetermined time has elapsed from the time when the power supply is turned on, and at the time when the second predetermined time has elapsed from the time when the power supply is turned on, and on and after the second predetermined time has elapsed, the registration condition is made every time the second predetermined time elapses. Thus, in other words, it can also be said that the registration condition is made more frequently during the time period from the time when the power supply for head 40 is turned on to the time when the second predetermined time (for example, 24 hours) elapses than on and after the second predetermined time elapses from the time the power supply is turned on.

Returning to the operation data registration processing, if CPU 81 determines that the registration execution flag F takes the value 0, CPU 81 returns to step S100. On the other hand, if CPU 81 determines that the registration execution flag F takes the value 1, CPU 81 sequentially drives the axis motors at a predetermined rotation speed (step S170) and measures peak values of torque of the individual motors then (step S180). The processing operations in steps S170, S180 are performed to measure a deterioration with age of each of the axis driving devices and are executed when head 40 is not in operation, that is, neither the component pickup process nor the component mounting process is executed.

CPU 81 registers the operation values measured in steps S100, S120 to S150, and S180 in the operation data storage memory 88 (step S190). Then, CPU 81 sets the registration execution flag F at the value 0 (step S200), and ends the operation data registration processing.

Figure 9:
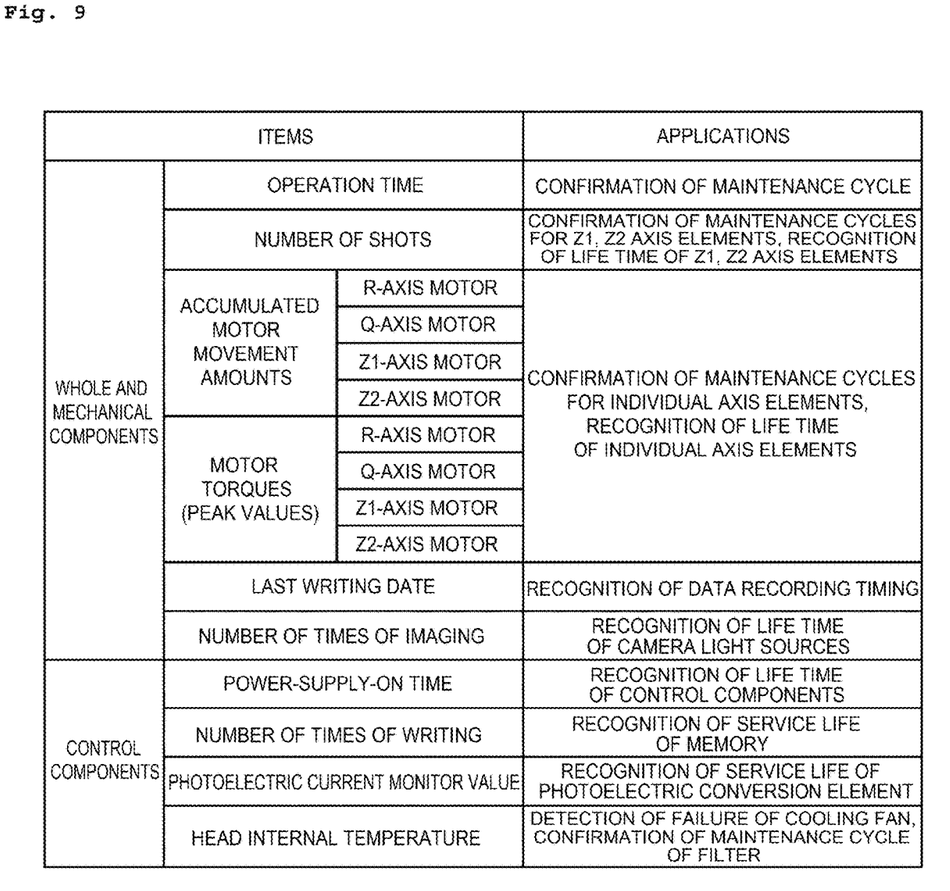
FIG. 9 is an explanatory view showing examples of operation values (operation data).

FIG. 9 is an explanatory view showing examples of operation values (operation data). As shown in the figure, operation values include data indicating operating statuses of the whole of head 40 and the mechanical components and data indicating operating statuses of the control components. The former data includes operation time and number of shots, accumulated movement amounts of the motors (R-axis motor 51, Q-axis motor 61, and Z-axis motors 71, 76), motor torques (peak values), last writing date, and numbers of times of imaging of side cameras 45, 46. The operation time is used to obtain a maintenance cycle of head 40. The number of shots is used to confirm the maintenance cycles of the constituent components (motors, gears, guides, ball screws, and the like) that make up first and second Z-axis driving devices 70, 75 and obtain life time of the constituent components. The accumulated movement amounts of the motors and the torques (the peak values) of the motors are used to confirm the maintenance cycles of the constituent components (the motors and the gears) that make up the individual axis driving devices (R-axis driving device 50, Q-axis driving device 60, Z1- and Z2-axis driving devices 70, 75) and obtain the life time thereof. The numbers of times of imaging of side cameras 45, 46 mean the numbers of times of illumination of camera light sources and are used to obtain life time of the camera light sources. On the other hand, the latter data includes power-supply-on time, number of times of writing, photoelectric current monitor value, head internal temperature, and the like. The power-supply-on time is used to obtain life time of the control components such as CPU 81 of control board 80 and the like. The number of times of writing is used to obtain a remaining life time of operation data storage memory 88. The photoelectric current monitor value is used to obtain a remaining life time of transmission and reception device 85 (photoelectric conversion element). The head internal temperature is used to detect a failure of the cooling fan for control board 80 and obtain a maintenance cycle of the filter.

Figure 10:
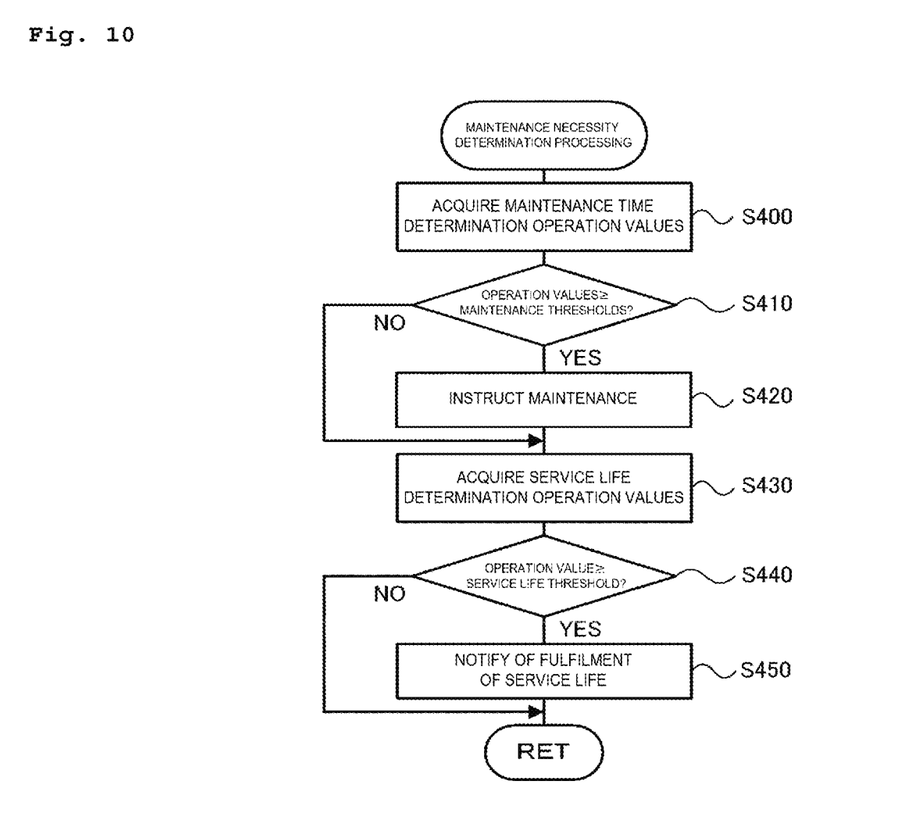
FIG. 10 is a flowchart showing an example of a maintenance necessity determination processing that is executed by management device 100.

Next, the operation of management device 100 will be described. FIG. 10 is a flowchart showing an example of a maintenance necessity determination processing executed by CPU 101 of management device 100. This processing is repeatedly executed every predetermined time period.

In the maintenance necessity determination processing, CPU 101 first acquires maintenance time determination operation values (operation data) (step S400). Here, in the present embodiment, the maintenance time determination operation values include operation time, number of shots, accumulated motor movement amounts, motor torques (peak values), and head internal temperature. Subsequently, CPU 101 compares the maintenance time determination operation values so acquired with maintenance thresholds (step S410). The maintenance thresholds are thresholds for determining the necessity of maintenance of the corresponding constituent components and are determined in advance for the individual constituent components. If CPU 101 determines that any one of the acquired maintenance time determination operation values is equal to or greater than the corresponding maintenance threshold, CPU 101 determines that the corresponding component of head 40 needs maintenance and outputs a maintenance instruction to display 106 (step S420). On the other hand, if CPU 101 determines that all the acquired maintenance time determination operation values are smaller than the corresponding maintenance thresholds, CPU 101 determines that no maintenance is required and skips step S420.

Next, CPU 101 acquires life time determination operation values (operation data) (step S430). Here, in the present embodiment, the life time determination operation values include number of shots, accumulated motor movement amounts, motor torques, number of times of imaging, power-supply-on time, number of times of writing, and photoelectric current monitor values. Subsequently, CPU 101 compares the acquired operation values and life time thresholds (step S440). Here, the life time thresholds are thresholds for determining remaining life time of the corresponding constituent components and are determined individually for the corresponding constituent components in advance. If CPU 101 determines that the operation value of any one of the acquired life time determination operation values is equal to or greater than the corresponding life time threshold, CPU 101 determines that the corresponding constituent component has reached the limit of its life time and outputs a message in this respect to display 106 (step S450), ending the maintenance necessity determination processing. On the other hand, if CPU 101 determines that all the acquired life time determination operation values are smaller than the corresponding life time thresholds, CPU 101 determines that none of the constituent component has reached the limit of its life time, ending the maintenance necessity determination processing.

Here, the correspondence between the main elements of the present embodiment and main elements of the present disclosure which are described in claims will be described. That is, operation data storage memory 88 corresponds to a storage section, and CPU 81 of control board 80 corresponds to a storage control section.

Needless to say, the present disclosure is not limited in any way to the embodiment that has been described heretofore, and hence, the present disclosure can be carried out in various forms without departing from the technical scope of the present disclosure.

For example, in the embodiment that has been described heretofore, CPU 81 is described as storing, as the operation data of head 40, operation time, number of shots, accumulated movement amounts of the motors, motor torques, last writing date, number of times of imaging, power-supply-on time, number of times of writing, photoelectric current monitor values, and head internal temperature in operation data storage memory 88. However, CPU 81 may omit the storage of a part of the operation data. In addition, in a head including a Z-axis driving device including a Z-axis motor for lifting up and lowering a Z-axis slider, a Q-axis driving device including a Q-axis motor mounted on the Z-axis slider to rotate a nozzle holder, and a power supply cable for supplying electric power to the Q-axis motor, the number of times of vertical reciprocation of the power supply cable may be included in the operation data that is stored in the operation data storage memory 88.

In addition, in the embodiment that has been described heretofore, CPU 81 is described as storing the operation data in operation data storage memory 88 more frequently during the time period when the second predetermined time elapses since the power supply to head 40 is turned on than on and after the second predetermined time has elapsed. However, CPU 81 may be configured to store the operation data in operation data storage memory 88 at constant time intervals irrespective of the elapsed time since the power supply is turned on.

In the embodiment described above, operation data storage memory 88 is described as being configured as a non-volatile memory. However, the operation data storage memory may be configured as a volatile memory. In this case, head 40 desirably includes a battery for holding data in the operation data storage memory.

As has been described heretofore, the gist of the mounting head of the present disclosure resides in a mounting head configured to be detachably attached to a mounting device main body, including a storage section having multiple storage areas, and a storage control section configured to acquire multiple operation data relating to an operation of the mounting head individually at different timings and store the multiple operation data individually in the multiple storage areas in such a state that the mounting head is attached to the mounting device main body.

The mounting head of the present disclosure includes the storage section and the storage control section configured to acquire the operation data relating to the operation of the mounting head and store the operation data in the storage section. The storage section has the multiple storage areas. The storage control section acquires the multiple operation data individually at the different timings and stores the multiple operation data individually in the multiple storage areas. As a result, the operating status of the mounting head can be grasped in greater detail by referring to the history of the operation data. For example, when some failure occurs in the mounting head, the cause for the occurrence of the failure can easily be identified by referring to the history of the operation data up to the occurrence of the failure.

In the mounting head of the present disclosure that is configured in the way described above, a configuration may be adopted in which the storage control section acquires the operation data at a first frequency until a predetermined time elapses since a power supply for the mounting head is activated for storage in the storage section and then acquires the operation data at a second frequency that is lower than the first frequency for storage in the storage section when the predetermined time elapses. As a result, not only can the operation history of the head be left much but also an excessive increase in data amount can be suppressed in the time period during which the state of the head is likely to be unstable.

In the mounting head of the present disclosure, the storage section may be made up of a ring buffer. As a result, operation data including a latest data as well as those stored over several times in the past can be stored in the storage section.

In the mounting head of the present disclosure, a configuration may be adopted in which the mounting head includes a motor configured to cause pickup members for picking up a component to operate, and the storage control section acquires at least one of a current applied to the motor and an accumulated rotation amount of the motor as the operation data for storage in the storage section. As a result, an extent of deterioration with age of the motor can be estimated.

In this case, a configuration may be adopted in which the mounting head is configured as a rotary head having a rotating body on which multiple holders for holding individually the pickup members are arranged on a single circumference and a rotating device for rotating the rotating body so as to cause the multiple holders to revolve in a circumferential direction, and has a first lifting and lowering device configured to cause a first holder of the multiple holders that is located in a first revolving position to be lifted up and lowered by driving a first lifting and lowering motor and a second lifting and lowering device configured to cause a second holder of the multiple holders that is located in a second revolving position, which differs from the first revolving position, to be lifted up and lowered by driving a second lifting and lowering motor, and the storage control section acquires, as the operation data, at least either electric currents that are applied individually to the first lifting and lowering motor and the second lifting and lowering motor or accumulated rotation amounts of the first lifting and lowering motor and the second lifting and lowering motor for storage in the storage section. As a result, the extent of deterioration of the components constituting the first lifting and lowering device and the second lifting and lowering device can be estimated.

In the mounting head of the present disclosure, a configuration may be adopted in which the mounting head is configured to communicate with the mounting device main body via an optical fiber and a photoelectric conversion element, and the storage control section acquires, as the operation data, an electric current that is photoelectrically converted by the photoelectric conversion element for storage in the storage section. As a result, an extent of deterioration of the photoelectric conversion element can be estimated.

In addition, in the mounting head of the present disclosure, a configuration may be adopted in which the storage control section stores, as the operation data, at least one of internal temperature of the mounting head, number of times of picking up and mounting a component by the mounting head, power-supply-on time for the mounting head, operation time of the mounting head, number of times of storage into the storage section, and last storage date of storage into the storage section.

In addition, the present disclosure is not limited to the form of the mounting head, and hence, the present disclosure may take the form of an operation data storing method. That is, the gist of an operation data storing method of the present disclosure resides in an operation data storing method for storing operation data relating to an operation of a mounting head configured to be detachably attached to a mounting device main body, including acquiring the operation data individually at multiple different timings and storing the operation data so acquired individually in such a state that the mounting head is attached to the mounting device main body.

The present disclosure can also take the form of a component mounting device. That is, the gist of a component mounting device of the present disclosure resides in a component mounting device for picking up a component and mounting the component so picked up onto a board, including a mounting device main body, and a mounting head configured to be detachably attached to the mounting device main body and having a storage section having multiple storage areas and a storage control section configured to acquire multiple operation data relating to an operation of the mounting head individually at different timings and store the multiple operation data individually in the multiple storage areas.

INDUSTRIAL APPLICABILITY

The present disclosure can be applied to an industrial field of manufacturing a component mounting device and a mounting head, or the like.

REFERENCE SIGNS LIST 1 component mounting system, 2 screen printing machine, 10 component mounting device, 11 base, 12 housing, 21 component supply device, 22 board conveyance device, 25 mark camera, 26 part camera, 31 X-axis guide rail, 32 X-axis slider, 33 X-axis motor, 35 Y-axis guide rail, 36 Y-axis slider, 37 Y-axis motor, 40 head, 41 head main body, 42 nozzle holder, 44 suction nozzle, 45, 46 side camera, 48 temperature sensor, 50 R-axis driving device, 51 R-axis motor, 52 R shaft, 53 transmission gear, 55 R-axis position sensor, 60 Q-axis driving device, 61 Q-axis motor, 62 cylindrical member, 62a spur gear, 63 transmission gear, 64 Q-axis gear, 65 Q-axis position sensor, 70 first Z-axis driving device, 71, 76 Z-axis motor, 72, 77 Z-axis slider, 74, 79 Z-axis position sensor, 75 second Z-axis driving device, 80 control board, 81 CPU, 82 ROM, 84 RAM, 85 transmission and reception section, 86 communication line, 87 current sensor, 88 operation data storage memory, 90 control device, 91 CPU, 92 ROM, 93 HDD, 94 RAM, 95 transmission and reception section, 100 management device, 101 CPU, 102 ROM, 103 HDD, 104 RAM, 105 input device, 106 display, P component, S board.

The invention claimed is:

1. A mounting head configured to be detachably attached to a mounting device main body, comprising:
 a storage section having multiple storage areas; and
 a storage control section configured to acquire multiple operation data relating to an operation of the mounting head individually at different timings and store the multiple operation data individually in the multiple storage areas in such a state that the mounting head is attached to the mounting device main body,
 wherein the storage control section acquires the operation data at a first frequency until a predetermined time elapses since a power supply for the mounting head is activated for storage in the storage section and then acquires the operation data at a second frequency that is lower than the first frequency for storage in the storage section when the predetermined time elapses.

2. The mounting head according to claim 1, wherein the storage section is made up of a ring buffer.

3. The mounting head according to claim 1, the mounting head being configured to communicate with the mounting device main body via an optical fiber and a photoelectric conversion element,
 wherein the storage control section acquires, as the operation data, an electric current that is photoelectrically converted by the photoelectric conversion element for storage in the storage section.

4. The mounting head according to claim 1, wherein the storage control section stores, as the operation data, at least one of internal temperature of the mounting head, number of times of picking up and mounting a component by the mounting head, power-supply-on time for the mounting head, operation time of the mounting head, number of times of storage into the storage section, and last storage date of storage into the storage section.

5. A mounting head configured to be detachably attached to a mounting device main body, comprising:
a storage section having multiple storage areas;
a storage control section configured to acquire multiple operation data relating to an operation of the mounting head individually at different timings and store the multiple operation data individually in the multiple storage areas in such a state that the mounting head is attached to the mounting device main body; and
a motor configured to cause pickup members for picking up a component to operate,
wherein the storage control section acquires at least one of a current applied to the motor and an accumulated rotation amount of the motor as the operation data for storage in the storage section.

6. The mounting head according to claim 5,
the mounting head being configured as a rotary head having a rotating body on which multiple holders for holding individually the pickup members are arranged on a single circumference and a rotating device for rotating the rotating body so as to cause the multiple holders to revolve in a circumferential direction,
the mounting head having a first lifting and lowering device configured to cause a first holder of the multiple holders that is located in a first revolving position to be lifted up and lowered by driving a first lifting and lowering motor and a second lifting and lowering device configured to cause a second holder of the multiple holders that is located in a second revolving position, which differs from the first revolving position, to be lifted up and lowered by driving a second lifting and lowering motor,
wherein the storage control section acquires, as the operation data, at least either electric currents that are applied individually to the first lifting and lowering motor and the second lifting and lowering motor or accumulated rotation amounts of the first lifting and lowering motor and the second lifting and lowering motor for storage in the storage section.

7. An operation data storing method for storing operation data relating to an operation of a mounting head configured to be detachably attached to a mounting device main body, comprising:
acquiring the operation data individually at multiple different timings and storing the operation data so acquired individually in such a state that the mounting head is attached to the mounting device main body
wherein the operation data is acquired at a first frequency until a predetermined time elapses since a power supply for the mounting head is activated and then the operation data is acquired at a second frequency that is lower than the first frequency when the predetermined time elapses.

8. A component mounting device for picking up a component and mounting the component so picked up onto a board, comprising:
a mounting device main body; and
a mounting head configured to be detachably attached to the mounting device main body and having a storage section having multiple storage areas and a storage control section configured to acquire multiple operation data relating to an operation of the mounting head individually at different timings and store the multiple operation data individually in the multiple storage areas
wherein the storage control section acquires the operation data at a first frequency until a predetermined time elapses since a power supply for the mounting head is activated for storage in the storage section and then acquires the operation data at a second frequency that is lower than the first frequency for storage in the storage section when the predetermined time elapses.

* * * * *